(12) United States Patent
Mayr

(10) Patent No.: US 9,962,721 B2
(45) Date of Patent: May 8, 2018

(54) DEVICE AND METHOD FOR COATING A SUBSTRATE

(71) Applicant: EV Group E. Thallner GmbH, St. Florian am Inn (AT)

(72) Inventor: Christoph Mayr, Diersbach (AT)

(73) Assignee: EV GROUP E. THALLNER GMBH, St. Florian am Inn (AT)

( * ) Notice: Subject to any disclaimer, the term of this patent is extended or adjusted under 35 U.S.C. 154(b) by 8 days.

(21) Appl. No.: 14/785,731

(22) PCT Filed: Apr. 1, 2014

(86) PCT No.: PCT/EP2014/056539
§ 371 (c)(1),
(2) Date: Oct. 20, 2015

(87) PCT Pub. No.: WO2014/187600
PCT Pub. Date: Nov. 27, 2014

(65) Prior Publication Data
US 2016/0082453 A1    Mar. 24, 2016

(30) Foreign Application Priority Data

May 23, 2013 (DE) .......................... 10 2013 105 320

(51) Int. Cl.
*B05B 9/00* (2006.01)
*B05D 1/02* (2006.01)
(Continued)

(52) U.S. Cl.
CPC ................ *B05B 9/002* (2013.01); *B05D 1/02* (2013.01); *B05D 3/048* (2013.01); *B05D 3/0486* (2013.01);
(Continued)

(58) Field of Classification Search
CPC ..................................................... B05D 3/048
See application file for complete search history.

(56) References Cited

U.S. PATENT DOCUMENTS

| 2001/0050042 A1 | 12/2001 | DeSimone et al. | ............. 118/52 |
| 2002/0124797 A1 | 9/2002 | Kitano et al. | ............. 118/213 |

(Continued)

FOREIGN PATENT DOCUMENTS

| CN | 101932312 A | 12/2010 | ............ A61K 9/70 |
| DE | 199 52 604 | 10/2000 | ............ B05C 1/04 |

(Continued)

OTHER PUBLICATIONS

International Search Report from corresponding International Patent Application No. PCT/EP2014/056539, dated Jul. 2, 2014.

*Primary Examiner* — Michael P Rodriguez
(74) *Attorney, Agent, or Firm* — Kusner & Jaffe

(57) ABSTRACT

A device for coating of a surface of a substrate with a coating material which has at least one coating component and at least one solvent, with the following features: a chamber which can be pressurized, a holding apparatus for holding the substrate on a holding surface and a spray nozzle for coating of the substrate, characterized in that the device has cooling means for cooling of at least the surface of the substrate which is held on the holding surface of the holding apparatus. Furthermore the invention relates to a corresponding method.

4 Claims, 3 Drawing Sheets

(51) Int. Cl.
*H01L 21/67* (2006.01)
*B05D 3/00* (2006.01)
*B05D 3/04* (2006.01)

(52) U.S. Cl.
CPC ........ B05D 3/0493 (2013.01); H01L 21/6715 (2013.01); H01L 21/67109 (2013.01); *B05D 3/00* (2013.01); *B05D 3/002* (2013.01); *B05D 3/0426* (2013.01)

(56) References Cited

U.S. PATENT DOCUMENTS

| | | | |
|---|---|---|---|
| 2004/0048002 A1* | 3/2004 | Shifflette | B05D 1/02 427/430.1 |
| 2004/0124797 A1 | 7/2004 | Takeuchi et al. | 318/466 |
| 2008/0085467 A1* | 4/2008 | Sasao | G11B 7/24044 430/270.11 |
| 2010/0297213 A1 | 11/2010 | Dupont et al. | 424/447 |
| 2012/0006493 A1 | 1/2012 | White et al. | 156/345.52 |

FOREIGN PATENT DOCUMENTS

| | | | | |
|---|---|---|---|---|
| DE | 199 41 760 | | 3/2001 | ............. B05B 15/12 |
| DE | 20 2011 000 789 U1 | | 6/2011 | ............. B05C 19/00 |
| FR | 2 926 466 | | 7/2009 | ............... A61L 15/16 |
| JP | 2010-005507 A | | 1/2010 | ............... B05B 5/00 |
| WO | WO 2003/39765 A1 | | 5/2003 | ............... B05D 1/04 |

* cited by examiner

DEVICE AND METHOD FOR COATING A SUBSTRATE

FIELD OF THE INVENTION

The invention relates to a device for coating of a surface of a substrate and a corresponding method.

BACKGROUND OF THE INVENTION

In the coating of wafers in resist spraying systems there is the problem of homogenous application of the coating, especially the resist, to the wafers which have a very large area in the meantime, for example with a diameter of 300 mm. The uniform coating of structured substrates is especially problematical.

SUMMARY OF THE INVENTION

The object of the invention is to devise a device and a method for coating of substrates in which more uniform coating takes place.

This object is achieved with the features of the independent claim(s). Advantageous developments of the invention are given in the dependent claims. All combinations of at least two of the features given in the specification, the claims and/or the figures also fall within the scope of the invention. At the given value ranges, values within the indicated limits will also be considered to be disclosed as boundary values and will be claimed in any combination.

The invention describes a system and a method using which spray-coated resist layers as uniform as possible can be deposited on structured surfaces. The homogeneity relates generally to all parameters, therefore layer thickness, chemical composition, etc. Hereinafter the homogeneity relates mainly to the layer thickness. One finding lies especially in that a coating component, especially a resist, must be diluted with solvent and is therefore relatively "mobile". The solvent is used for spraying of the viscous liquid coating component. At latest in the vapor deposition of the solvent this can lead to a more or less rough surface. The invention makes this finding its own by the phase transitions of the coating material being used in a dedicated manner for producing a surface as uniform as possible in the spray application of the resist coating, especially by pressure control and/or temperature control.

The solvents used are generally different from resist to resist. Generally they are organic solvents. Solvents preferred are the following:
PGMEA
Diethylether
Isopropanol
Hexafluoroethane
Mesitylene
Ethanol
Propanol
Acetone
Water The advantages of the invention consist in that a simple, gentle, economical and efficient method is shown for how a uniform and preferably smooth surface can be produced by spray coating.

A phase is defined as an inherently uniform region of largely identical chemical and physical properties which is separated from another phase by a phase boundary.

A component is defined as a unit which can no longer be physically and chemically divided during thermodynamic examination. Examples of components would be the elements of the periodic chart, molecules such as water, ethane, propane, butene, diethylether or even macromolecules such as proteins. The solvents examined below and the substances dissolved in them, mainly resists, can therefore be regarded as components.

A phase diagram is defined as a representation of the regions of existence of phases as a function of different, especially thermodynamic parameters, especially as a function of pressure and temperature.

The regions of existence of the phases of a single-component system are shown in a pressure-temperature diagram. FIG. 1 shows a symbolic pressure-temperature phase diagram of a single-component system of any solvent at moderate temperatures and pressures.

The behavior of the systems examined below, therefore the solvents and their dissolved substances, at extremely low and extremely high temperatures, as well as at extremely high pressures, is not of interest for the invention. Therefore the pressure-temperature phase diagram is shown mainly around the triple point T. The three phase regions of solid, liquid and gaseous are separated from one another by characteristic pressure-temperature curves. The curve 1 is the so-called sublimation or resublimation curve which separates the phase existence region of the solid phase from the phase existence region of the gaseous phase. Curve 2 is the vaporization or condensation curve which represents the set of all pressure-temperature combinations on which liquid and gaseous phases are in equilibrium with one another. Curve 3 is the melting or solidification curve. Along the curves two phases are always in thermodynamic equilibrium with one another.

The following typical temperature and pressure values for the triple points of some substances are disclosed:
diethylether (156.93 K)
acetone (178.86 K)
isopropanol (184.96 K)
hexafluoroethane (173.08 K, 26.60 kPa)
water (273.16 K, 0.6117 kPa)

The temperature region at least on one holding surface of a holding apparatus for holding the substrate to be coated is therefore between 300 K and 0 K, preferably between 275 K and 0 K, more preferably between 250 K and 0 K, still more preferably between 200 K and 0 K and most preferably between 150 K and 0 K. The cooling can take place for example electrically via Peltier element or via cooling means, especially cooling liquid and/or cooling gases. If heating of the holding apparatus should be necessary, this takes place preferably electrically.

The preferred pressure working region of a (resist spraying) chamber of the device, which chamber can be pressurized, is between $10^5$ Pa and 1 Pa, more preferably between $10^4$ Pa and 1 Pa, still more preferably between $10^3$ Pa and 1 Pa and most preferably between $10^2$ Pa and 1 Pa.

For a single-component system there is exactly one point in the pressure-temperature phase diagram, therefore a pressure-temperature combination in which all three phases are in thermodynamic equilibrium with one another. This point is called the triple point T.

A two-component system in simplified form is examined below. The two-component system includes a solvent and the first component which is present in excess. The second component is a coating component, the substance dissolved in the solvent, preferably a resist. It is apparent that by introducing a second component the complete and correct representation of a thermodynamic system can take place only in a pressure-temperature-concentration diagram.

Based on the fact that we are interested in any case only in the physical and chemical properties of the solvent, the altered pressure-temperature phase diagram after dissolution of the dissolved substance is sufficient for the description of the invention (FIG. 2).

If a dissolved substance is added to a solvent, the phase equilibrium boundaries of the solvent which is now a two-component system, a binary system, change (FIG. 2). The elevation of the boiling point at a certain pressure is called the boiling point elevation. Since this boiling point elevation generally applies to the entire pressure domain along the boiling curve 2, the boiling line of the pure solvent when a dissolved substance is added shifts to the right. Accordingly, along the solidification curve 3 there is a freezing point depression, i.e. by dissolving a substance the freezing point of the solvent shifts to lower temperatures at constant pressure.

The depression of the vapor pressure at a certain temperature is called the vapor pressure depression. The vapor pressure depression and the boiling point elevation or freezing point depression are generally directly proportional to one another. The boiling point elevation, the freezing point depression and the vapor pressure depression depend solely on the concentration and not the type of dissolved substances. The ability of a substance to change the physical and/or chemical properties of a second substance independently of its chemistry, but only by its amount, is called the colligative property.

The pressure-temperature phase diagram which is fixed by the colligative properties of the dissolved substance is used as a foundation for the (resist spraying) method of the invention.

In industry solely resist spraying systems have been operated to date which atomize the solution of solvent and resist in the liquid state and apply it to the substrate at moderate temperatures and pressures. FIG. 3 shows the process region B (coating, especially resist-coating application) of current resist spraying systems. Temperatures and/or pressures can be changed or are very probably changed. In any case the two-component system solvent-resist is always in the liquid state. This liquid state causes a correspondingly low viscosity. The low viscosity is caused mainly by the solvent. A not inconsiderable part of the solvent also vaporizes during the actual spraying process.

After the actual resist spraying process in the process region B the substrate is heat-treated either on a heating plate provided for this purpose or directly on the heatable sample holder. This heat treatment 4 is used to accelerate the vaporization of the solvent. Preferably the solvent to be vaporized has higher volatility, therefore a higher vapor pressure, than the resist which is actually of interest and which covers the surface. The resist partially sets by the continuous removal of the solvent and heat. In some types of resists an additional heat treatment step which occurs at higher temperatures can take place.

A major disadvantage in this type of spray application of the resist-coating is that before and possibly also during the vaporization of the solvent the resist on its surface forms a rough surface due to the increased mobility of the liquid solvent.

The idea of the invention is based on not applying the resist dissolved in the solvent in the liquid state to the surface of an especially structured substrate, preferably a wafer, but on freezing the resist during the coating, especially the spray application of the resist-coating, or during the impact of the coating material on the surface of the substrate, especially in the manner of a shock (FIG. 4).

The execution takes place in a special chamber in which there is a sample holder which can accommodate the substrate and which can cool it especially at the same time. Furthermore the spray chamber is optionally designed as a vacuum chamber in which the pressure can be regulated at least within the pressure ranges which are relevant to the phase transitions, in particular by means of a control apparatus.

The process flow is shown in the pressure-temperature phase diagram according to FIG. 4. Proceeding from a coating region B' on which the coating material is still liquid, when the coating material is incident on the cooled surface of the sample holder, shock freezing (5) takes place. Due to the shock freezing (5) it is made impossible for the resist which is dissolved in the solvent to produce a rough surface by thermal movements.

In another step (6), the gentle sublimation transition of the solvent contained in the coating material into the gaseous state, which transition takes place at low temperatures, takes place especially without vaporizing the coating component. Preferably under these process parameters the vapor pressure of the solvent is at least 1.001 times as great, preferably twice as great, more preferably at least 10 times as great, still more preferably 100 times as great, most preferably of all at least 1000 times as great as the vapor pressure of the coating component which has been dissolved in the solvent. By gentle sublimation of the solvent and due to the low temperatures the coating material is concentrated more and more with the coating component since the solvent gradually evaporates. The resist is deposited more and more until starting at a certain point all the solvent is evaporated.

A corresponding (resist spraying) chamber includes an especially coolable (cooling means) sample holder and a vacuum-tight housing of the chamber which can be evacuated. The attainable vacuum is especially smaller than $10^{-1}$ mbar, preferably smaller than $10^{-3}$ mbar, more preferably smaller than $10^{-5}$ mbar, still more preferably smaller than $10^{-7}$ mbar, most preferably smaller than $10^{-9}$ mbar.

The sample holder can be especially one of the following types of sample holders:
vacuum sample holder
electrostatic sample holder
magnetic sample holder
sample holder with mechanical clamping
sample holder with adhesive surfaces In one special embodiment which can be combined in particular with the above described ones, the surface of the wafer can be cooled via a cooling nozzle (cooling means) also by cold gases, shortly before and/or during the coating. This would have the advantage that the entire substrate need not be thoroughly cooled, but that the surface of the substrate is briefly cooled very locally before the resist is sprayed on. Preferably vaporized liquid nitrogen or helium is used for this purpose. The entire process is controlled and optimized by the external, especially software-supported control apparatus. All the fundamental capabilities of a coating device (especially a resist spraying system) which are known to one skilled in the art are not influenced by the use of the process of the invention. The manner in which the spray nozzle applies the dissolved resist, i.e., with which speed, movement, can remain unchanged.

In the (resist spraying) chamber there is especially one holding apparatus which can be temperature-regulated at least on the holding surface. The adjustable temperature range of the holding device is preferably between −200° C. and 400° C., preferably between −200° C. and 200° C., more preferably between −200° C. and 0° C.

Other advantages, features and details of the invention will become apparent from the following description of preferred exemplary embodiments and using the drawings.

DETAILED DESCRIPTION OF THE INVENTION

FIGS. 1 to 4 were described above for the general part of the invention.

Figure 1:
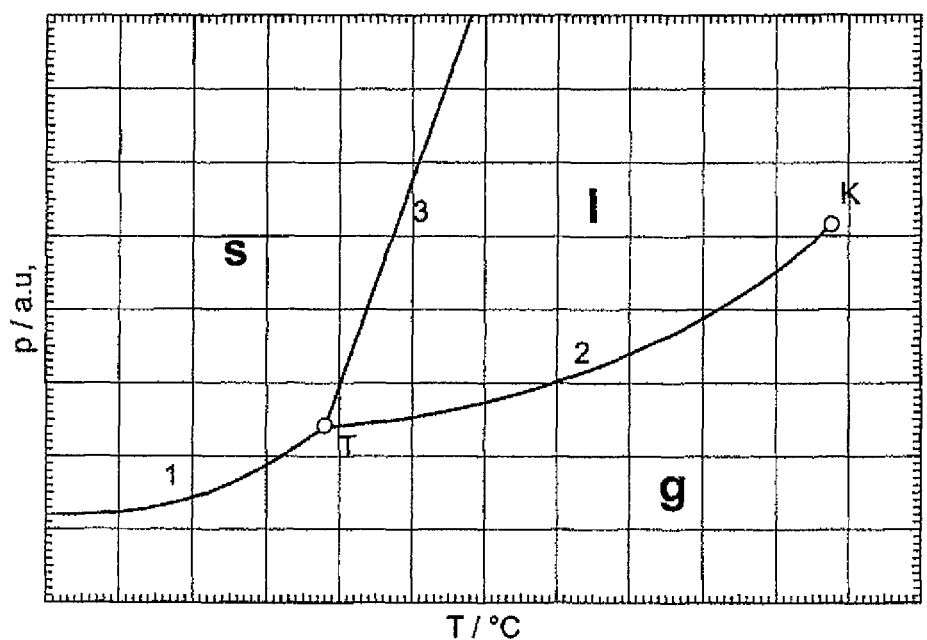
FIG. 1 shows a p-T phase diagram of a single-component system.
Figure 2:
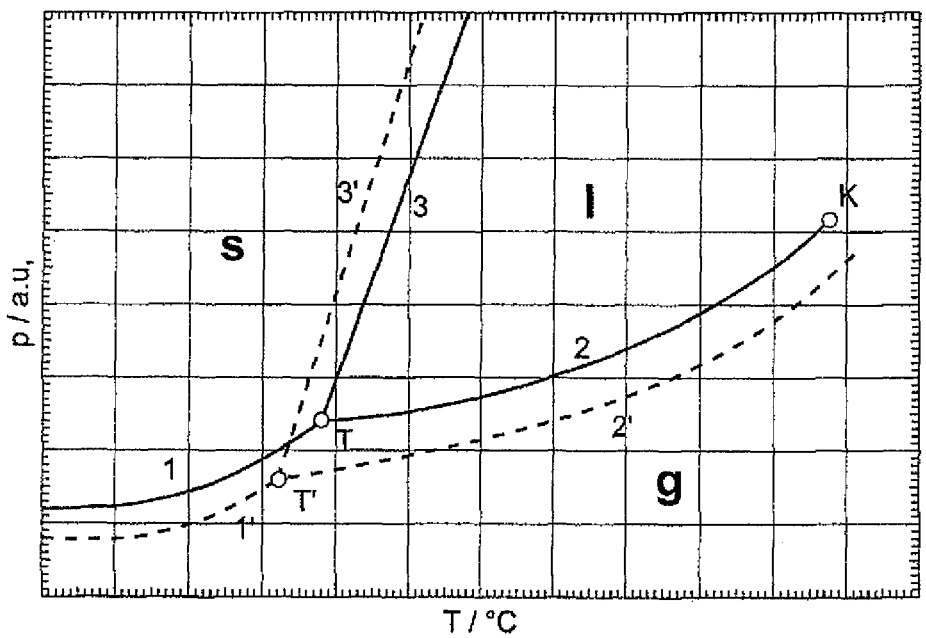
FIG. 2 shows a p-T phase diagram of a two-component system of the invention.
Figure 3:
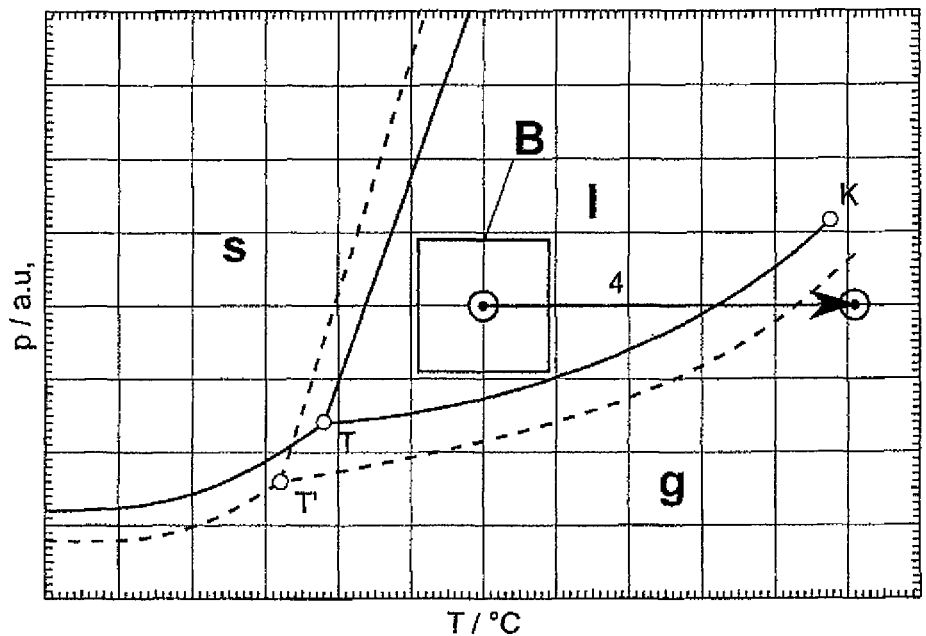
FIG. 3 shows a p-T phase diagram of a two-component system of the invention with a method according to the prior art.
Figure 4:
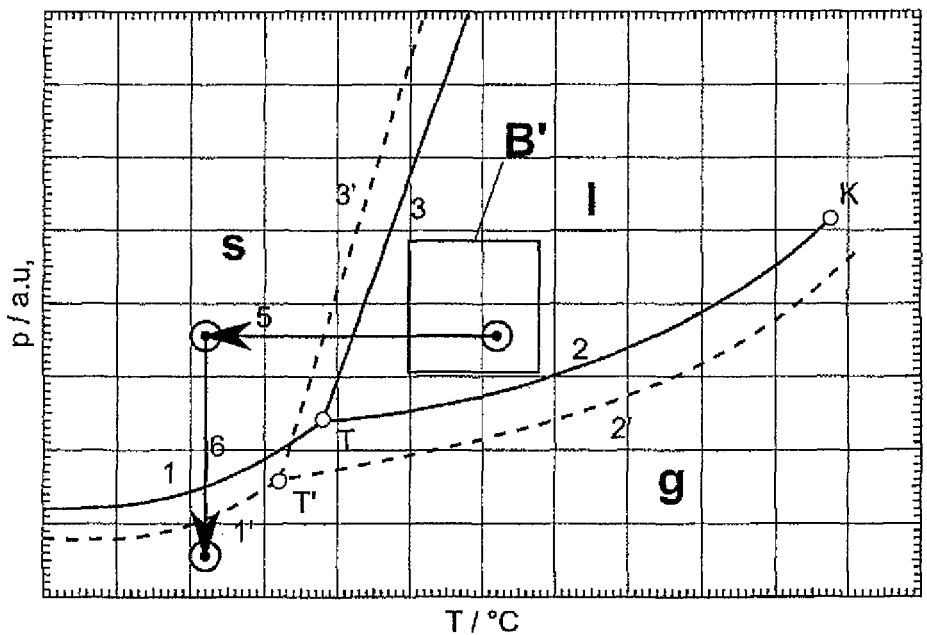
FIG. 4 shows a p-T phase diagram of a two-component system of the invention with a method sequence of the invention and FIG. 5 shows a schematic of one embodiment of the device of the invention.
Figure 5:
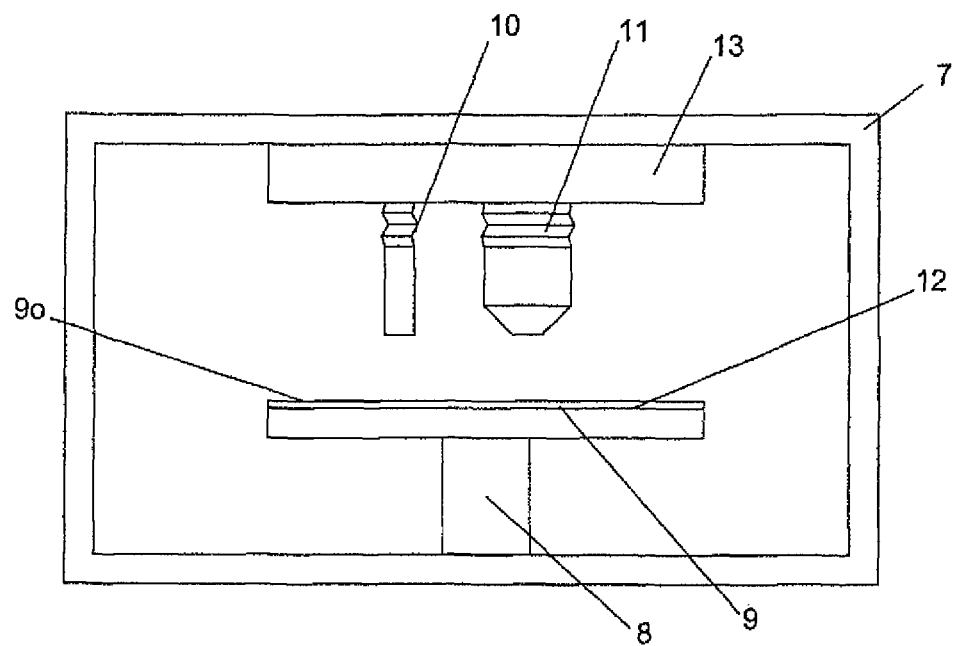

FIG. 5 shows a schematic of a chamber 7 which can be evacuated, with a holding apparatus 8 whose temperature can be regulated and which can be mainly cooled, on whose holding surface 12 is a substrate 9 (especially a wafer). Above the holding apparatus 8 a spray nozzle 11 and an (optional) cold nozzle 10 are attached to a holding device 13. The spray nozzle 11 and the cold nozzle 10 can preferably be adjusted/controlled independently of one another by a control apparatus which is not shown, and can reach the entire surface 9o of the substrate 9 to be coated.

REFERENCE NUMBER LIST

1 sublimation or resublimation curve
2 evaporation or condensation curve
3 melting or solidification curve
4 heat treatment
5 freezing
6 sublimation transition
7 chamber
8 holding apparatus
9 substrate
9o surface
10 cold nozzle
11 spray nozzle
12 holding surface
13 holding device
s solid phase
l liquid phase
g gaseous phase
B coating
B' coating

The invention claimed is:

1. A method for applying a resist to a substrate by spray coating, wherein the method comprises:
   providing a substrate having a substrate surface,
   holding the substrate on a holding surface of a holding apparatus located inside a chamber which can be pressurized with a pressure,
   providing a coating material comprised of (i) a resist having at least one coating component and (ii) at least one solvent, wherein the resist is dissolved in the at least one solvent,
   spraying the coating material onto the substrate surface to coat the substrate surface with the coating material,
   cooling at least the substrate surface during the spraying of the substrate surface with the coating material, such that the resist is shock frozen during impact of the coating material on the substrate surface, and
   depositing the resist onto the substrate surface to form a resist layer thereon by sublimation of the at least one solvent in the coating material.

2. The method as claimed in claim 1, wherein pressure and temperature on the substrate surface are controlled by a control apparatus.

3. The method as claimed in claim 1, wherein during the spraying of the coating material onto the substrate surface, at least the substrate surface has a temperature below the phase transition temperature of the coating material from liquid to solid.

4. The method as claimed in claim 1, wherein the sublimation of the at least one solvent includes decreasing the pressure in the chamber over the phase boundary of the at least one solvent from solid to gaseous, while the phase boundary of the at least one coating component from solid to gaseous is not exceeded.

* * * * *